United States Patent
Tajima et al.

(10) Patent No.: US 7,915,972 B2
(45) Date of Patent: Mar. 29, 2011

(54) BALANCE FILTER AND DUPLEXER

(75) Inventors: Motoyuki Tajima, Yokohama (JP); Toshio Nishizawa, Yokohama (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 160 days.

(21) Appl. No.: 11/896,225

(22) Filed: Aug. 30, 2007

(65) Prior Publication Data

US 2008/0224790 A1    Sep. 18, 2008

(30) Foreign Application Priority Data

Aug. 30, 2006  (JP) .................. 2006-233416

(51) Int. Cl.
*H03H 9/72* (2006.01)
*H03H 9/64* (2006.01)

(52) U.S. Cl. .................. 333/133; 333/193; 333/195

(58) Field of Classification Search .................. 333/133, 333/193, 195

See application file for complete search history.

(56) References Cited

U.S. PATENT DOCUMENTS

| | | | |
|---|---|---|---|
| 6,667,673 B1 | 12/2003 | Strauss | |
| 6,710,676 B2 * | 3/2004 | Yata et al. | 333/133 |
| 6,762,657 B2 * | 7/2004 | Takamine | 333/193 |
| 7,042,313 B2 * | 5/2006 | Yata | 333/193 |
| 7,116,189 B2 * | 10/2006 | Takamine | 333/195 |
| 7,295,089 B2 * | 11/2007 | Shibahara et al. | 333/193 |
| 7,425,879 B2 * | 9/2008 | Taniguchi | 333/133 |
| 2002/0021195 A1 * | 2/2002 | Takamine | 333/195 |
| 2002/0075101 A1 | 6/2002 | Takamine | |
| 2002/0109431 A1 | 8/2002 | Yata et al. | |
| 2002/0135442 A1 * | 9/2002 | Sawada et al. | 333/195 |
| 2004/0075511 A1 | 4/2004 | Inoue et al. | |
| 2004/0155730 A1 * | 8/2004 | Iwamoto et al. | 333/193 |
| 2004/0233020 A1 | 11/2004 | Nakamura et al. | |
| 2006/0044079 A1 * | 3/2006 | Nishizawa et al. | 333/193 |
| 2006/0181369 A1 * | 8/2006 | Shibahara | 333/195 |
| 2007/0159269 A1 | 7/2007 | Taniguchi | |

FOREIGN PATENT DOCUMENTS

| | | |
|---|---|---|
| EP | 1 168 613 A2 | 1/2002 |
| EP | 1 337 039 A1 | 8/2003 |
| EP | 1 592 130 A2 | 11/2005 |
| EP | 1 630 956 A2 | 3/2006 |
| EP | 1 717 953 A2 | 11/2006 |

(Continued)

OTHER PUBLICATIONS

Inoue S. et al: "1.9 GHz range ultra-low-loss and steep cut-off double mode SAW filter for the rx band in the PCS antenna duplexer" IEEE Ultrasonics Symposium, vol. 1, Oct. 5, 2003, pp. 389-392, XP010701221 figures 7,9; sections IV, V.

*Primary Examiner* — Barbara Summons
(74) *Attorney, Agent, or Firm* — Arent Fox LLP

(57) ABSTRACT

A balance filter includes a first filter having first multimode surface acoustic wave (SAW) filters connected in parallel, a second filter that is connected to the first filter and includes a second multimode SAW filter, a first terminal connected to the first filter, and second terminals connected to the second filter. An input terminal of the balance filter is one of the first and second terminals, and an output terminal thereof is the other. Electric signals transmitted from the first to second filters or vice versa are in opposite phase. Electric signals are input or output via the second terminals in opposite phase.

12 Claims, 12 Drawing Sheets

FOREIGN PATENT DOCUMENTS

| | | |
|---|---|---|
| JP | 2001-292050 A | 10/2001 |
| JP | A-2002-135078 A | 5/2002 |
| JP | 2002-314370 A | 10/2002 |
| JP | A-2002-300005 A | 10/2002 |
| JP | 3391347 B2 | 1/2003 |
| JP | A-2003-179458 A | 6/2003 |
| JP | 2003-249842 A | 9/2003 |
| JP | A-2004-128928 A | 4/2004 |
| JP | A-2004-194269 A | 7/2004 |
| JP | 2006-74202 A | 3/2006 |
| JP | A-2007-189390 A | 7/2007 |
| WO | WO 2007/116760 A1 | 10/2007 |

\* cited by examiner

BALANCE FILTER AND DUPLEXER

BACKGROUND OF THE INVENTION

1. Field of the Invention

The present invention relates to balance filters and duplexers, and more particularly, to a balance filter having surface acoustic wave filters connected in parallel and a duplexer using such a balance filter.

2. Description of the Related Art

Recently, cellular phones have employed a receive system in which a received signal is of differential type (balance type) in order to restrain common mode noise in an RF circuit. Thus, the RF circuit needs RF devices of differential type (balance type).

Japanese Patent No. 3391347 discloses a balance filter (hereinafter referred to as first conventional art). FIG. 1 schematically shows the first conventional art. Referring to FIG. 1, a balance filter 30 includes an input surface acoustic wave filter 34 and an output surface acoustic wave filter 36, each of which filters is formed on a piezoelectric substrate 32 and is of multimode type. The input SAW filter 34 includes a pair of reflection electrodes R1, an input IDT2, an output IDT1 and an output IDT3. The IDT1, IDT2 and IDT3 are interposed between the pair of reflection electrodes R1. The output SAW filter 36 includes a pair of reflection electrodes R1, an output IDT5, an input IDT4 and an input IDT6. The IDT4, IDT5 and IDT6 are interposed between the pair of reflection electrodes R1. The input SAW filter 34 and the output SAW filter 36 are connected in series by a connection line 31 that connects the output IDT1 and the input IDT4, and a connection line 33 that connects the output IDT3 and the input IDT6. An input terminal 38 is connected to one of a pair of electrodes of the input IDT2, and the other is grounded. An output terminal 39 is connected to one of a pair of electrodes of the output IDT5 and the other is grounded.

Power is applied to the input terminal 38, multiple standing waves develop between the reflection electrodes R1 of the input SAW filter 34. The input IDT2, output IDT1 and output IDT3 are designed so that the output IDT1 and output IDT3 respectively detect standing waves that are in opposite phase, that is, 180° out of phase. Thus, electric signals transmitted through the connection lines 31 and 33 have opposite phases. That is, the opposite-phase signals are transmitted from the input SAW filter 34 to the output SAW filter 36. The output IDT5, the input IDT4 and input IDT6 are designed so that the opposite-phase signals transmitted to the output SAW filter 36 are output via a pair of output terminals 39 with the above phase relationship being kept. The balance filter shown in FIG. 1 has the above-mentioned balance function of outputting the opposite-phase signals via the pair of output terminals 39.

It is essential to transmit the opposite-phase signals from the input SAW filter 34 to the output SAW filter 36 for realizing the balance filter shown in FIG. 1. The balance filter thus configured has excellent amplitude and phase balance characteristics.

Japanese Patent Application Publication No. 2003-249842 (Document 2) discloses a SAW filter in which double mode SAW filters are connected in parallel. Japanese Patent Application Publication No. 2006-74202 discloses a multimode SAW filter in which multiple stages of IDTs are connected in series.

However, the balance filter of the first prior art does not have good power durability because all of input power is applied to the single input SAW filter 34. This problem may be solved by increasing the number of IDTs of the input SAW filter 34. However, this method may affect the pass band and may have difficulty in securing a satisfactory wide pass band.

The electric signals output from the balance filter formed on a chip are in opposite phase. However, in practice, when the chip is incorporated into a package, the electric signals output from the package may deviate from the opposite-phase relationship. In the first prior art, the input SAW filter 34 must be adjusted. However, this adjustment has difficulty because the input SAW filter outputs the signals that are in opposite phase.

SUMMARY OF THE INVENTION

The present invention has been made in view of the above-mentioned circumstances and provides a balance filter having improved power durability, easy balance adjustment after packaging and improved bandpass characteristics.

According to an aspect of the present invention, there is provided a balance filter including: a first filter having first multimode surface acoustic wave (SAW) filters connected in parallel; a second filter that is connected to the first filter and includes a second multimode SAW filter; a first terminal connected to the first filter; and second terminals connected to the second filter, an input terminal of the balance filter being one of the first and second terminals, and an output terminal thereof being the other, electric signals transmitted from the first to second filters or vice versa being in opposite phase, electric signals being input or output via the second terminals in opposite phase.

According to another aspect of the present invention, there is provided a duplexer having the balance filter mentioned above.

BRIEF DESCRIPTION OF THE DRAWINGS

Preferred embodiments of the present invention will be described with reference to the accompanying figures, wherein.

DETAILED DESCRIPTION

A description will now be given of embodiments of the present invention with reference to the accompanying drawings.

First Embodiment

Figure 1:
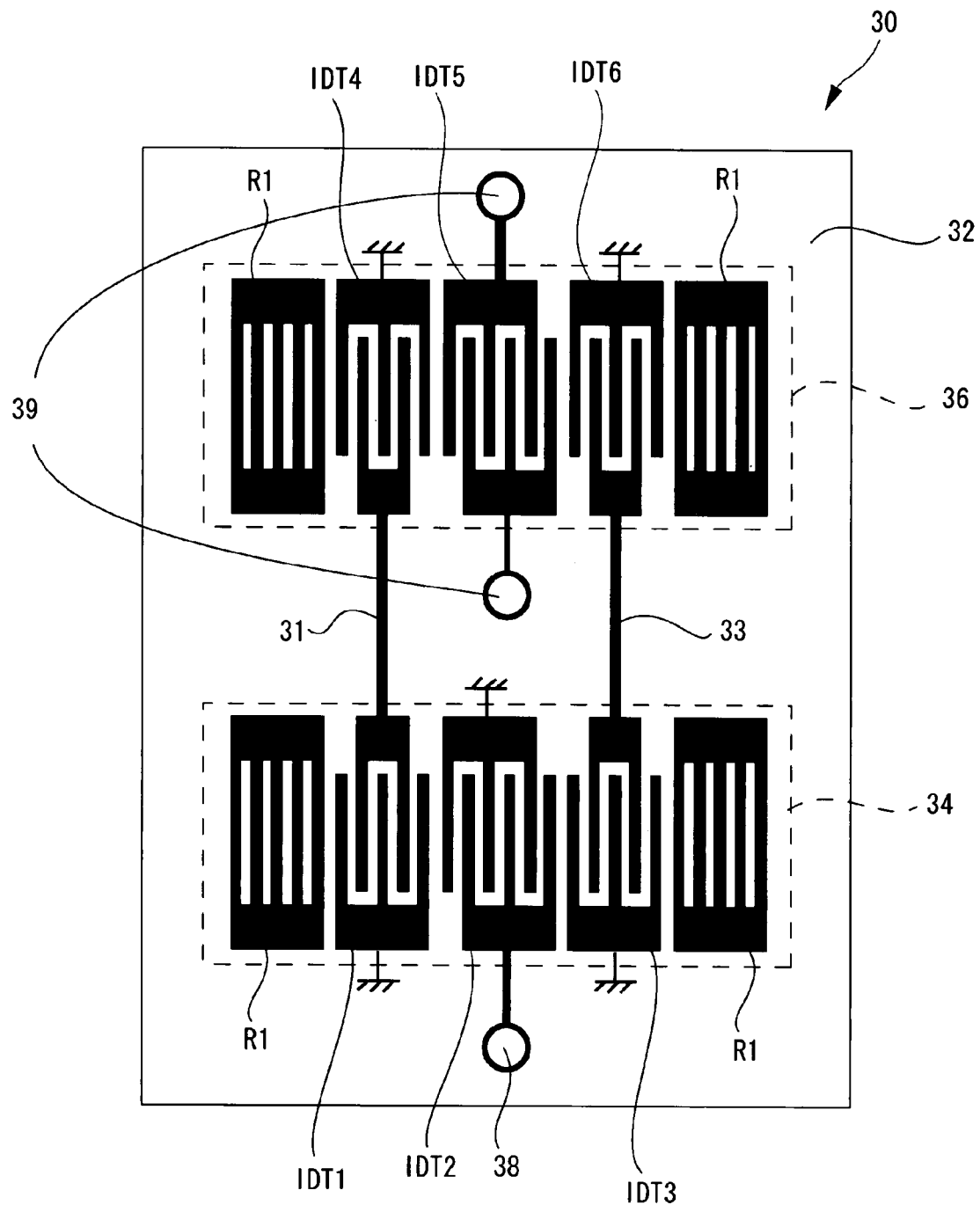
FIG. 1 schematically shows a balance filter of a first prior art.
Figure 2:
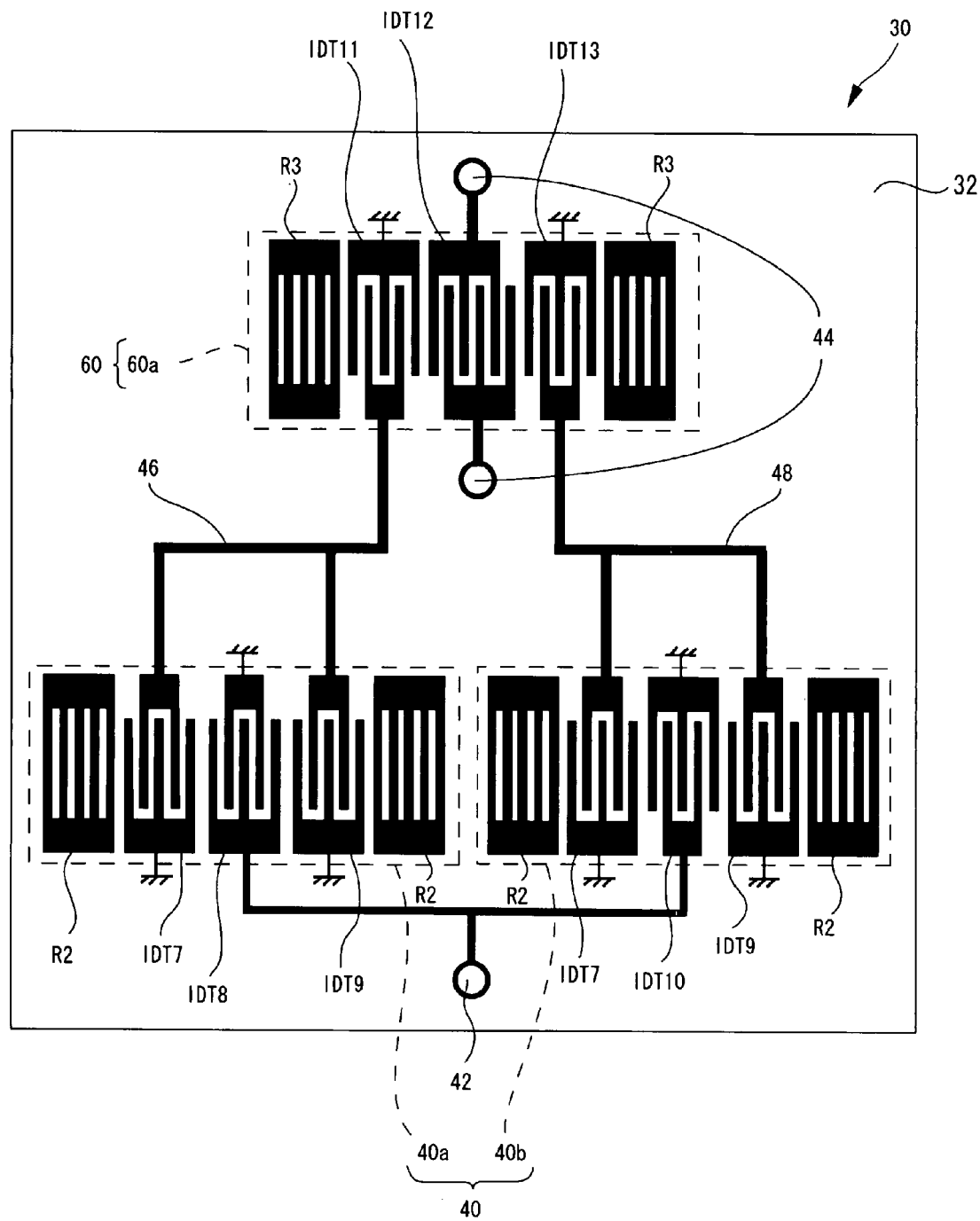
FIG. 2 schematically shows a balance filter in accordance with a first embodiment.

FIG. 2 schematically shows a balance filter in accordance with a first embodiment. Referring to FIG. 2, a balance filter 30 has a piezoelectric substrate 32 made of, for example, $LiNbO_3$ or $LiTaO_3$ on which IDTs and reflection electrodes are formed. The IDTs and the reflection electrodes may be formed by a metal film made of, for example, aluminum (Al). The balance filter 30 includes a first filter 40 that is a first multimode SAW filter, and a second multimode filter 60 that is a second multimode SAW filter. The first filter 40 is made up of filters 40a and 40b connected in parallel. The filter 40a has an input IDT8, an output IDT7, an output IDT9 and two reflection electrodes R2. The output IDT7 and the output IDT9 are located at both sides of the input IDT8 in a SAW propagation direction. The reflection electrodes R2 are located further out than the output IDT7 and the output IDT9 in the SAW propagation direction. Similarly, the filter 40b has an input IDT10, an output IDT7, an output IDT9 and two reflection electrodes R2. The output IDT7 and the output IDT9 are located at both sides of the input IDT10 in a SAW propagation direction. The reflection electrodes R2 are located further out than the output IDT7 and the output IDT9 in the SAW propagation direction.

The second filter 60 includes a filter 60a, which has an output IDT12, an input IDT11, an input IDT13, and two reflection electrodes R3. The input IDT11 and the input IDT13 are located at both sides of the output IDT12 in a SAW propagation direction. The reflection electrodes R3 are located further out than the input IDT11 and the input IDT13. A single first terminal 42 is connected to one of a pair of electrodes of the input IDT8 and one of a pair of electrodes of the input IDT10. In the first through third embodiments and a sixth embodiment, the first terminal 42 may be an input pad. The other electrodes of the input IDT8 and the input IDT10 are grounded. A second terminal 44 is connected to one of a pair of electrodes of the output IDT12, and another second terminal 44 is connected to the other electrode of the output IDT12. In the first through sixth embodiments, the second terminals 44 may be output pads. The first filter 40 and the second filter 60 are connected in series by connection lines 46 and 48. The connection line 46 connects the output IDT7 and the output IDT9 of the filter 40a to the input IDT11 of the filter 60a. The connection line 48 connects the output IDT7 and the output IDT9 of the filter 40b to the input IDT13 of the filter 60a.

The input IDT8, the input IDT10, the output IDT7 and the output IDT9 are designed so that electric signals propagated through the connection lines 46 and 48 are in opposite phase, namely, 180° out of phase.

The input IDT11, the input IDT13 and the output IDT12 are designed so that opposite-phase electric signals are available through the second terminals 44 connected to the two electrodes of the output IDT12.

According to the first embodiment, the filters 40a and 40b that form the first filter 40 are connected in parallel. When power is applied to the first terminal 42, the applied power is distributed to the filters 40a and 40b. Thus, each of the filters 40a and 40b is capable of receiving a reduced amount of power, so that the first filter 40 can have improved power durability, as compared to the first prior art. In addition, improved amplitude and phase balance characteristics can be achieved because the input IDT11 and the input IDT13 are supplied with the electric signals that are in opposite phase.

The electric signals supplied to the filter 60a are originated from the two separate filters 40a and 40b. By separately adjusting the filter 40a or 40b, it becomes possible to adjust the phases of the electric signals applied to the filter 60a and to thus adjust the phase of the electric signals available via the second terminals 44. Thus, in a case where the balance filter of the first embodiment is incorporated into a package, even if the electric signals output from the package deviate from the opposite-phase relationship, these electric signals can be adjusted as to be in opposite phase by adjusting the filter 40a or 40b. It is thus possible to easily perform the balance adjustment after packaging, as compared to the first prior art. The phases of the electric signals can be adjusted finely, so that improved phase balance can be realized, as compared to the first prior art.

Second Embodiment

Figure 3:
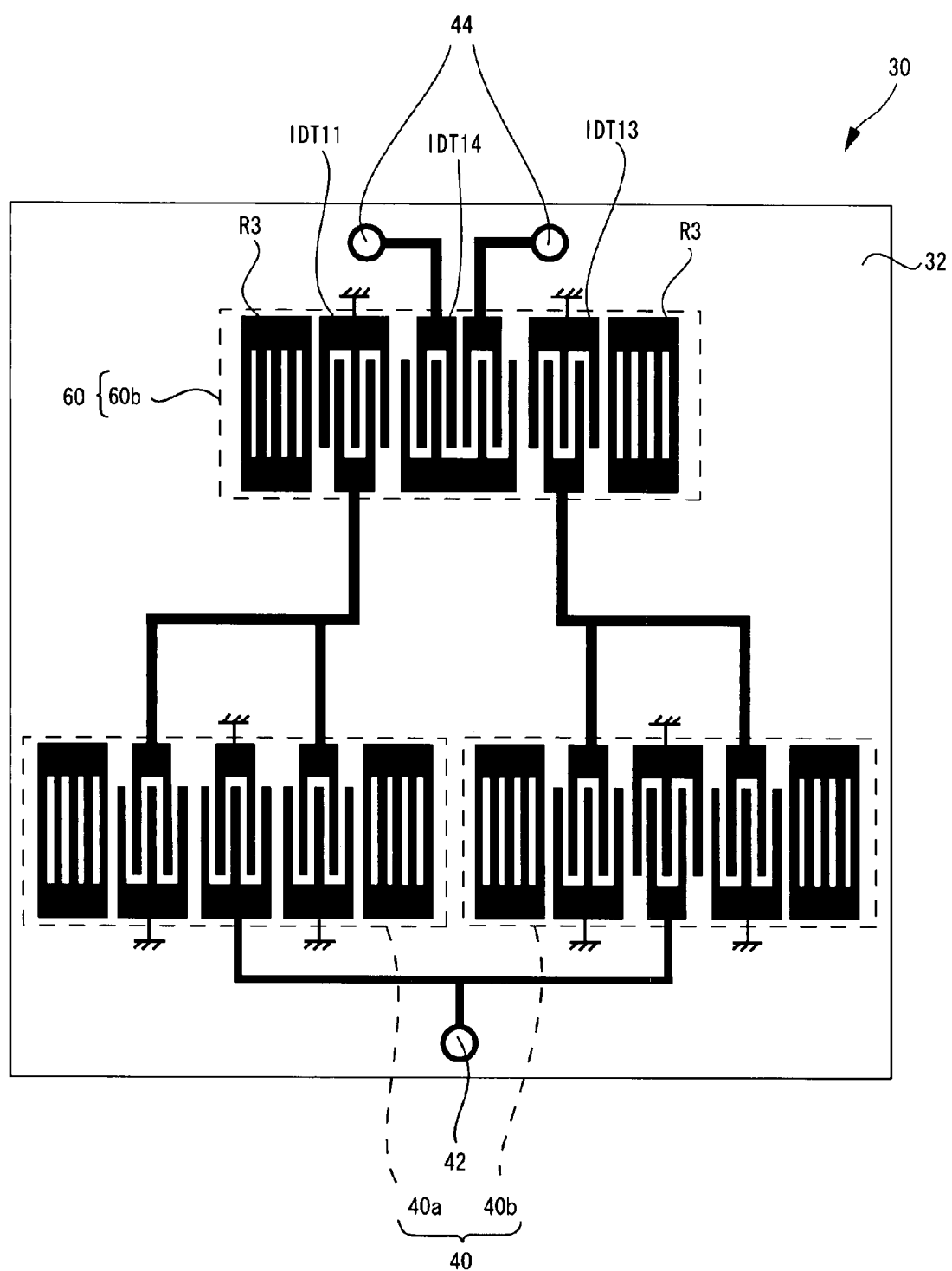
FIG. 3 schematically shows a balance filter in accordance with a second embodiment.

FIG. 3 schematically shows a balance filter in accordance with a second embodiment. Referring to FIG. 3, the balance filter 30 shown in FIG. 3 includes the first filter 40 and the second filter 60, which filters are formed on the piezoelectric substrate 32. The first filter 40 and the connection between the first filter 40 and the first terminal 42 of the second embodiment are the same as those of the first embodiment, and a description thereof will be omitted here. The second filter 60 includes a filter 60b, which is composed of the pair of reflection electrodes R3, the input IDT11, the input IDT13, and an output IDT14. One of a pair of electrodes of the output IDT14 is divided into two in the SAW propagation direction. Two second terminals 44 are respectively connected to the two divided electrodes. The two second terminals 44 run in a direction perpendicular to the SAW propagation direction. The first filter 40 and the second filter 60 are connected in the same manner as those in the first embodiment, and a description thereof will be omitted here.

The input IDT11, the input IDT13 and the output IDT14 are designed so that electric signals output via the second terminals 44 are in opposite phase.

The second embodiment has the same configurations as the first embodiment in terms of the first filter 40, the connection between the first filter 40 and the first terminal 42 and the connection between the first filter 40 and the second filter 60. Thus, the second embodiment has improved power durability and improved amplitude and phase balance characteristics, as compared to the first prior art. Further, like the first embodiment, the filters 40a and 40b can be adjusted separately in order to adjust the phases of the electric signals that are output via the second terminals 44. It is thus possible to perform the balance adjustment after packaging as in the case of the first embodiment.

The electrodes of the output IDT14 respectively connected to the second terminals 44 has a small adjacent area, as compared to those in the first embodiment. Thus, the second embodiment is capable of realizing a higher output impedance between the second terminals 44 than that of the first embodiment. This advantage makes it possible to easily design balance filters having an output impedance of 100 to 200Ω that has been recently demanded frequently.

The second terminals 44 of the second embodiment run in the direction vertical to the SAW propagation direction. This enables a higher flexibility of package layout than the first embodiment. Particularly, a symmetrical layout can easily be realized, so that the bandpass performance can be improved.

Third Embodiment

Figure 4:
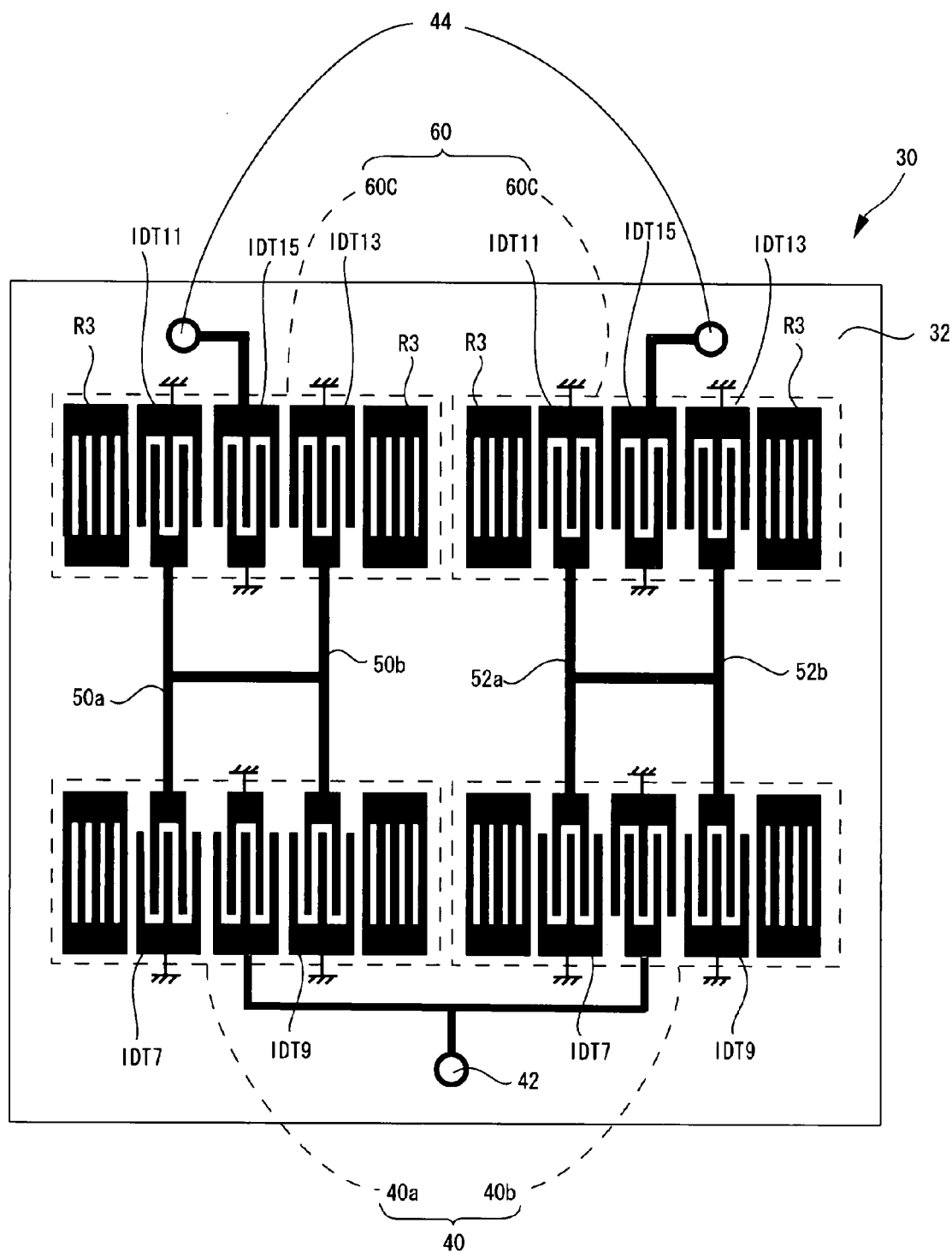
FIG. 4 schematically shows a balance filter in accordance with a third embodiment.

FIG. 4 schematically shows a balance filter in accordance with a third embodiment. Referring to FIG. 4, the balance filter 30 has the first filter 40 and the second filter 60, which filters are formed on the piezoelectric substrate 32. The third embodiment has the same configurations as the first embodiment in terms of the first filter 40, and the connection between the first filter 40 and the first terminal 42, and a description thereof will be omitted here. The second filter 60 has two filters 60c. Each of the filters 60c has an identical configuration and is composed of the pair of reflection electrodes R3, the input IDT11, the input IDT13 and an output IDT15. One of two electrodes of the output IDT15 is connected to the second terminal 44, and the other is grounded. The filter 40a and one of the two filters 60c are connected in series by connection lines 50a and 50b. The connection line 50a connects the output IDT7 and the input IDT11, and the connection line 50b connects the output IDT9 and the input IDT13. Similarly, the filter 40b is connected in series to the other filter 60c by connection lines 52a and 52b. The connection lines 50a and 50b are connected by a connection line that connects intermediate portions thereof. Similarly, the connection lines 52a and 52b are connected by a connection line that connects intermediate portions thereof.

Electric signals transmitted through the connection lines 50a and 50b are in phase, and electric signals transmitted through the connection lines 52a and 52b are in phase. Further, there is a 180° difference between the phase of the electric signals transmitted through the connection lines 50a and 50b and the phase of the electric signals transmitted through the connection lines 52a and 52b. Thus, the opposite-phase electric signals are available via the second terminals 44.

The third embodiment has the same configuration as the first embodiment in terms of the first filter 40, and the connection between the first filter 40 and the first terminal 42. Thus, like the first embodiment, the third embodiment has improved power durability as compared to the first prior art.

Further, the phases of the electric signals that are output via the second terminals 44 can be adjusted by separately adjusting a combination of the filter 40a and the associated filters 60c and another combination of the filter 40b and the associated filter 60c. It is thus possible to perform the balance adjustment after packaging as in the case of the first embodiment.

Furthermore, the two second terminals 44 are connected to the separate filters 60c. Thus, the third embodiment is capable of realizing a higher output impedance between the second terminals 44 than that of the first embodiment. This advantage makes it possible to easily design balance filters having an output impedance of 100 to 200Ω that has been recently demanded frequently.

The second terminals 44 of the third embodiment run in the direction vertical to the SAW propagation direction. This enables a higher flexibility of package layout than the first embodiment. Particularly, a symmetrical layout can easily be realized, so that the bandpass performance can be improved.

It may be possible to omit the connection line between the intermediate portions of the connection lines 50a and 50b and omit the connection line between the intermediate portions of the connection lines 52a and 52b. This variation has the same effects as those of the third embodiment.

Fourth Embodiment

Figure 5:
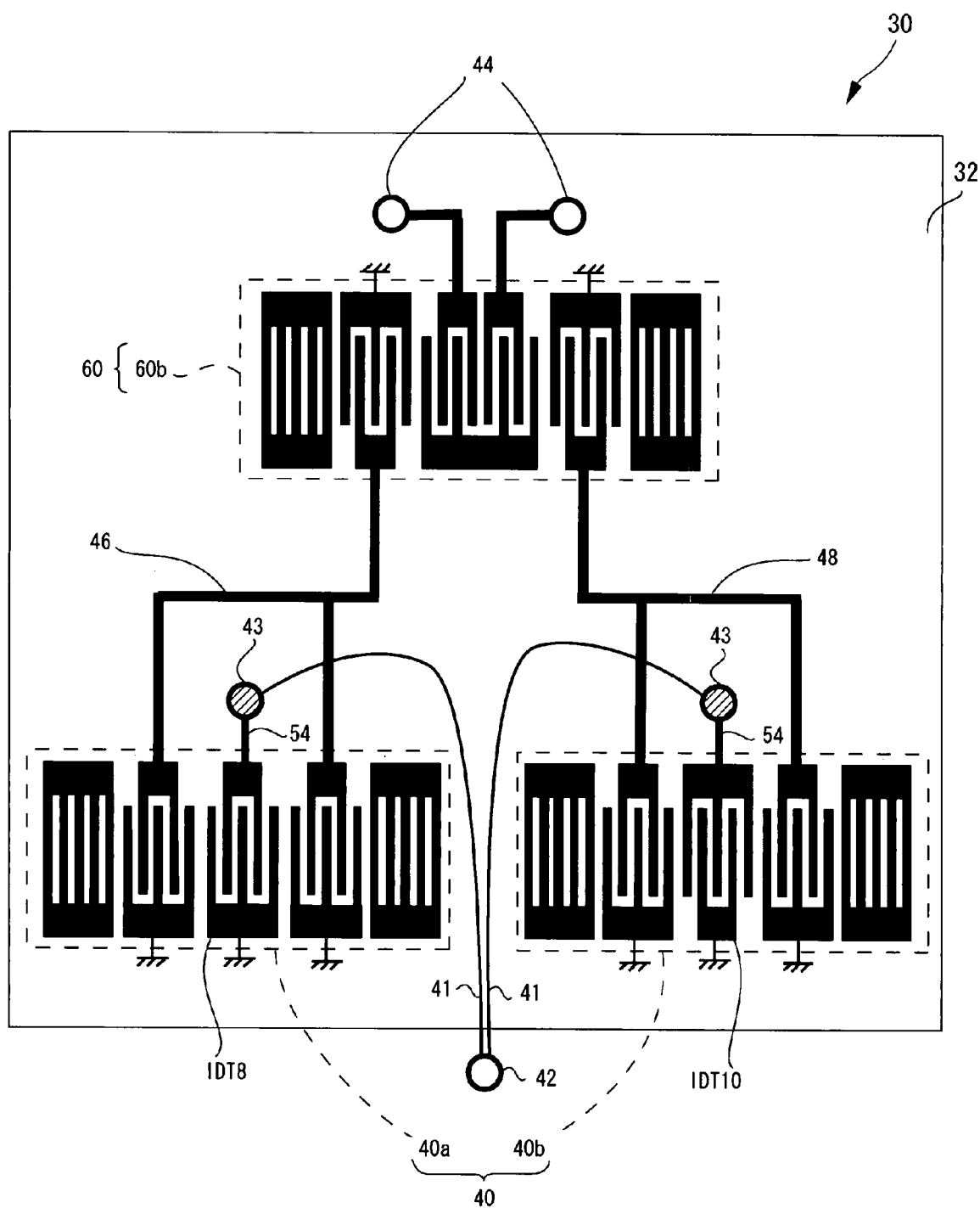
FIG. 5 schematically shows a balance filter in accordance with a fourth embodiment.

FIG. 5 schematically shows a balance filter in accordance with a fourth embodiment. Referring to FIG. 5, the balance filter 30 has the first filter 40 and the second filter 60, which filters are formed on the piezoelectric substrate 32. The filters 40a and 40b that form the first filter 40 are the same as those of the balance filter of the first embodiment, and a description thereof will be omitted here. The first terminal 42 functions as an input terminal and may be an input lead or an input footpad. The first terminal 42 is provided outside of the balance filter 30. The first terminal 42 is connected to the input IDT8 and input IDT10 by connection lines 54 via pads 43 connected to the first terminal 42 by wires 41. The connection lines 54 run in the same direction as the direction in which the connection lines 46 and 48 run. The connection lines 46 and 48 make connections between the first filter 40 and the second filter 60 in the same manner as those of the balance filter of the first embodiment. Further, the fourth embodiment has the same configurations as the balance filter of the second embodiment in terms of the second filter 60 and the connections between the second filter 60 and the second terminals 44, and a description thereof will be omitted here.

Figure 6:
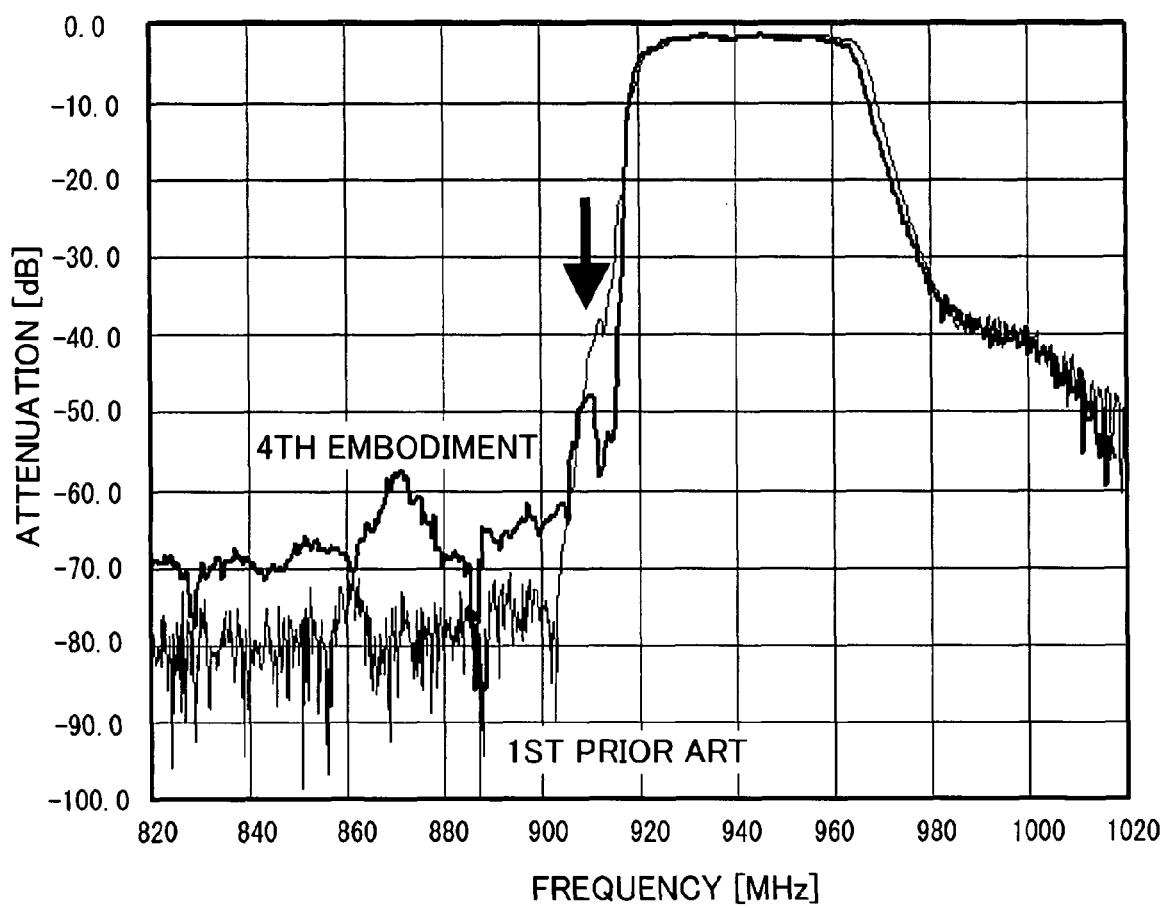
FIG. 6 is a graph of bandpass characteristics of the balance filters of the fourth embodiment and the first prior art.

FIG. 6 is a graph of bandpass characteristics of the balance filter of the fourth embodiment and the first prior art. A thick line relates to the fourth embodiment, and a thin line relates to the first prior art. The fourth embodiment and the first prior art have almost identical insertion losses in the pass band. In contrast, the fourth embodiment has a rapid increase in attenuation in a range (around 910 MHz) at the lower side of the pass band, as compared with the first prior art. The fourth embodiment is capable of sharply increasing attenuation at frequencies lower than those of the pass band without degrading the insertion loss. It is thus possible to suppress crosstalk and realize improved band-pass characteristics.

The fourth embodiment has the same configurations as the first embodiment in terms of the first filter 40, and the connections between the first filter 40 and the second filter 60. Thus, the fourth embodiment has improved power durability and improved amplitude and phase balance characteristics like the first embodiment. Further, the filters 40a and 40b can be separately adjusted so that the phases of the electric signals output via the second terminals 44 can be adjusted. Thus, the balance adjustment after packaging can be performed easily.

The fourth embodiment has the same configuration as the second embodiment in terms of the connections between the second filter 60 and the second terminals 44. Thus, the impedance between the second terminals 44 is as high as that in the second embodiment. Further, the symmetrical package layout can be realized so that improved bandpass characteristic can be achieved.

The above-mentioned fourth embodiment is based on the second embodiment. The concept of the fourth embodiment may be applied to the first and third embodiments, and similar advantages may be obtained.

Fifth Embodiment

Figure 7:
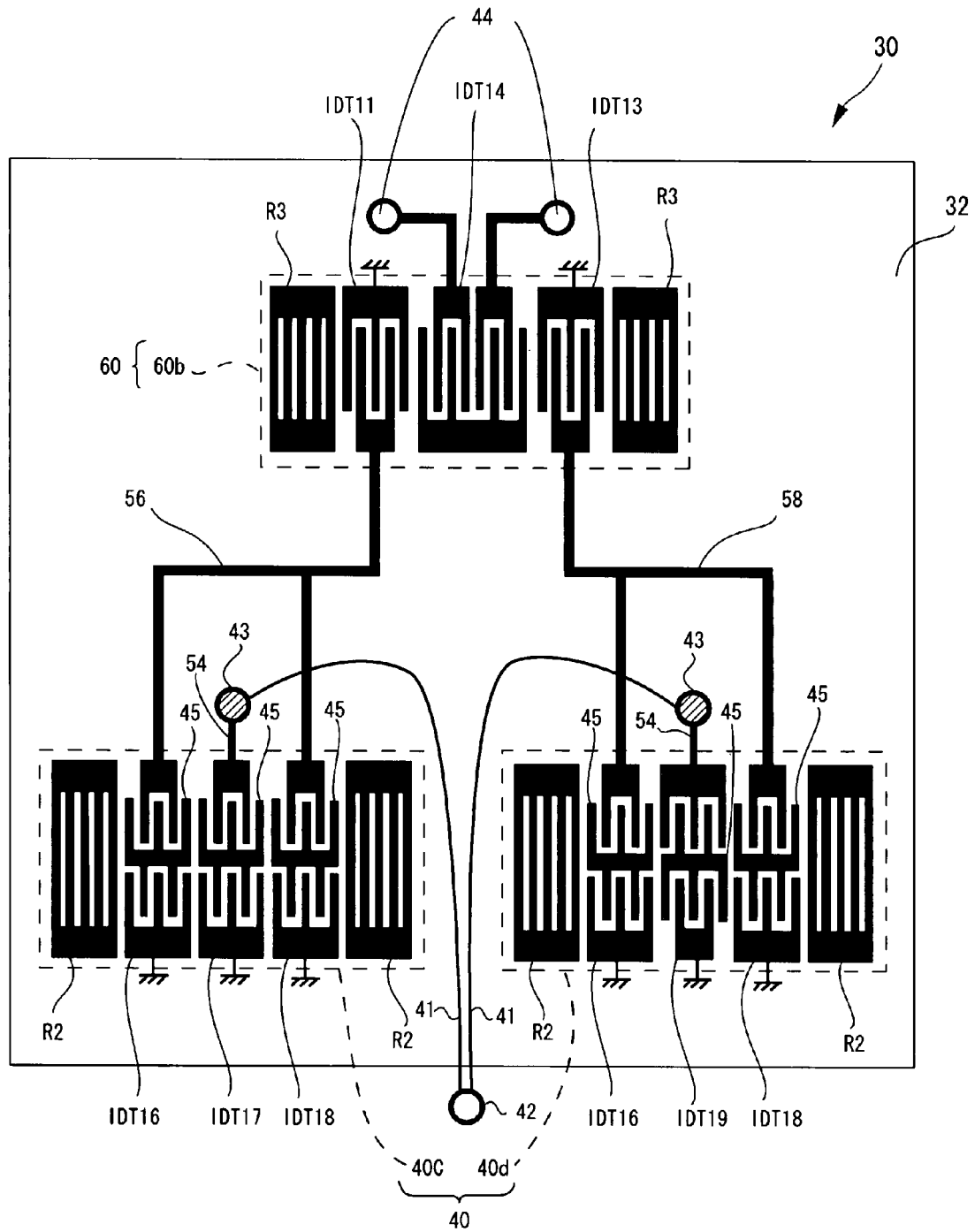
FIG. 7 schematically shows a balance filter in accordance with a fifth embodiment.

FIG. 7 schematically shows a balance filter in accordance with a fifth embodiment. Referring to FIG. 7, the balance filter 30 has the first filter 40 and the second filter 60, which filters are formed on the piezoelectric substrate 32. The first filter 40 is composed of filters 40c and 40d. The filter 40c has the pair of reflection electrodes R2 between which an input IDT17, an output IDT16 and an output IDT18 are arranged. The filter 40d has the pair of reflection electrodes R2 between which an input IDT19, an output IDT16 and an output IDT18 are arranged. Each of the input IDT17 and input IDT19 has a floating conductor 45 via which one of the two electrodes connected to the connection line 54 and the other electrode grounded are coupled in series in an aperture-length direction. Similarly, each of the output IDT16 and output IDT18 has a floating conductor 45 via which one of the two electrodes connected to a connection line 56 or 58 and the other electrode grounded are coupled in series in the aperture-length direction. The aperture-length direction is defined as a direction perpendicular to the SAW propagation direction. The firth embodiment has the same configurations as the second embodiment in terms of the second filter 60 and the connections between the second filter 60 and the second terminals 44, and a description thereof will be omitted here. The first filter 40 and the second filter 60 are connected in series by the connection lines 56 and 58. The connection line 56 connects the output IDT16 and output IDT18 of the filter 40c and the input IDT11 of the filter 60b. The connection line 58 connects the output IDT16 and output IDT18 of the filter 40d and the input IDT13 of the filter 60b. The first terminal 42 and the first filter 40 are connected as in the case of the fourth embodiment shown in FIG. 5.

The input IDT17, input IDT19, output IDT16 and output IDT18 are designed so that the electric signals transmitted through the connection lines 56 and 58 are in opposite phase.

According to the fifth embodiment, the two electrodes in each of the input and output IDTs that form the first filter 40 are coupled in series in the aperture-length direction via the floating conductor 45, so that the voltage applied to the IDTs can be distributed. Further, the IDT has an increased area due to the presence of the floating conductor 45. Thus, the intensity of SAW excitation per IDT unit area can be reduced, so that a reduced intermodulation level can be realized as compared to the first through fourth embodiments.

Further, the IDTs receive distributed voltages and the electrostatic resistance can be improved and power durability can also be improved as compared to the first through fourth embodiments.

The electric signals transmitted from the first filter 40 to the second filter 60 are in opposite phase, and the improved amplitude and phase characteristics can be obtained. Further, the filters 40c and 40d can be separately adjusted so that the phases of the electric signals output via the second terminals 44 can be adjusted. Thus, the balance adjustment after packaging can be performed easily.

The fifth embodiment has the same configuration as the second embodiment in terms of the connections between the second filter 60 and the second terminals 44. Thus, the impedance between the second terminals 44 is as high as that in the second embodiment. Further, the symmetrical package layout can be realized so that improved bandpass characteristic can be achieved.

The above-mentioned fifth embodiment is based on the fourth embodiment. The concept of the fifth embodiment may be applied to the first through third embodiments, and similar advantages may be obtained.

Sixth Embodiment

Figure 8:
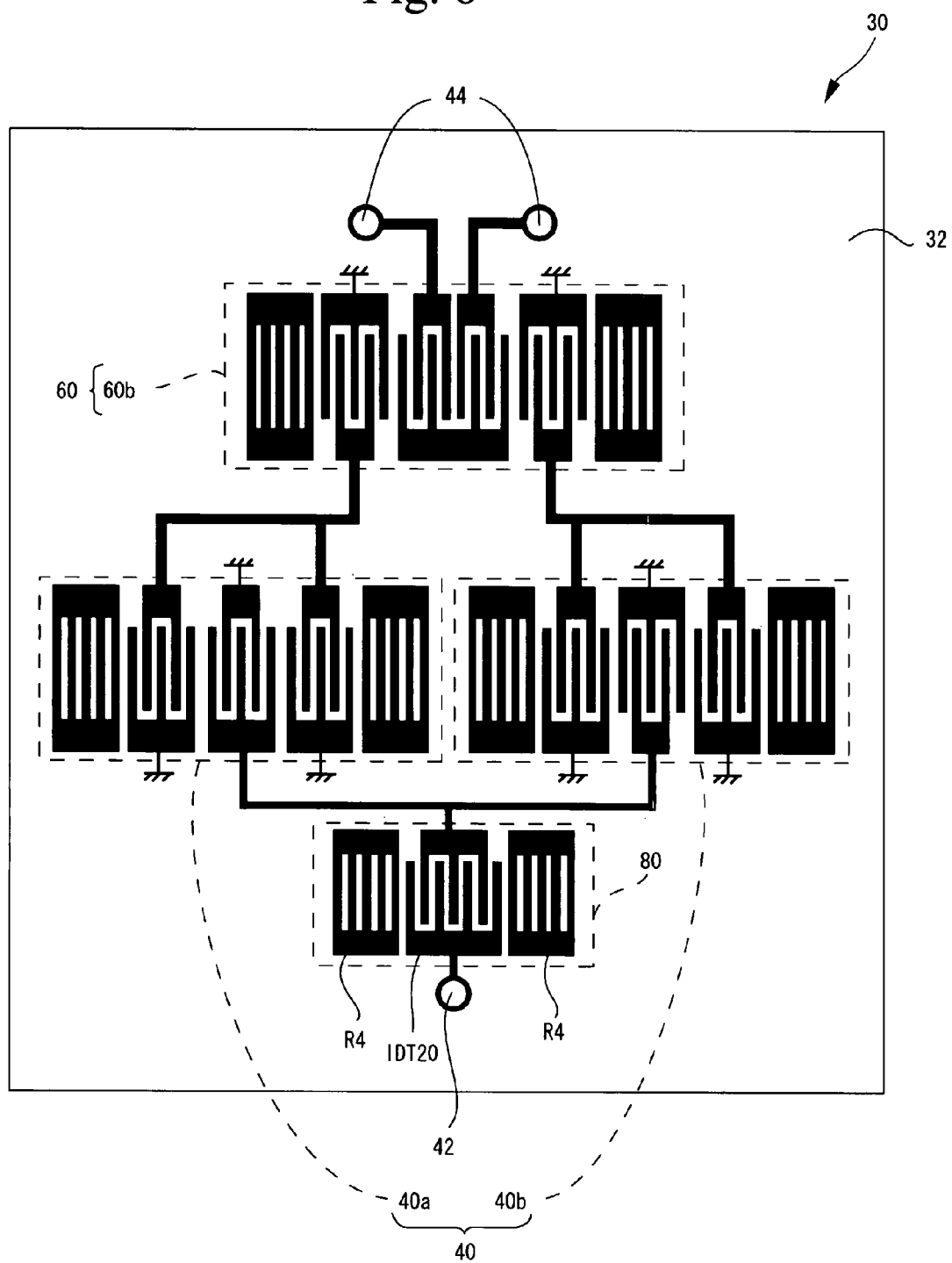
FIG. 8 schematically shows a balance filter in accordance with a sixth embodiment.
Figure 9:
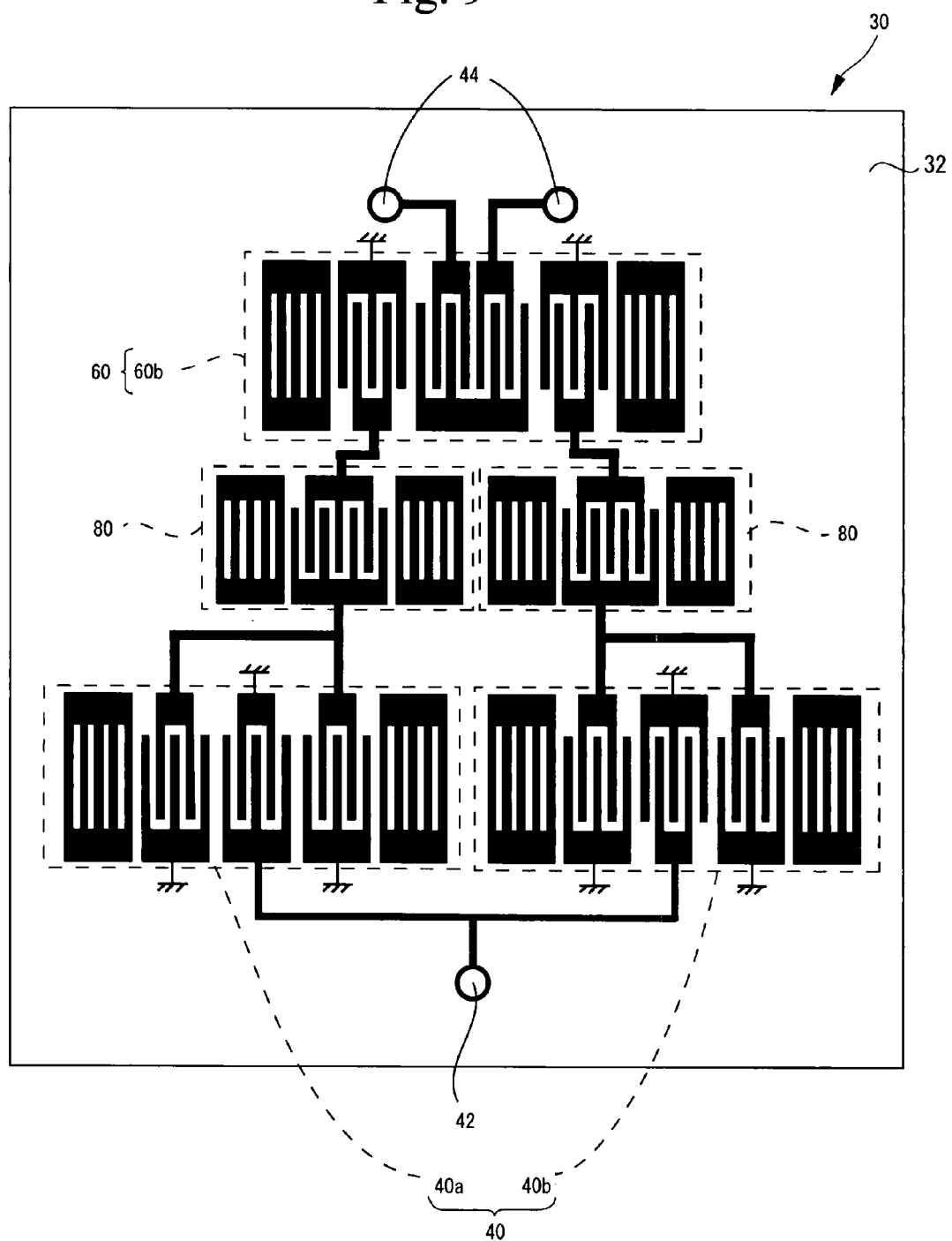
FIG. 9 schematically shows a balance filter in accordance with a first variation of the sixth embodiment.
Figure 10:
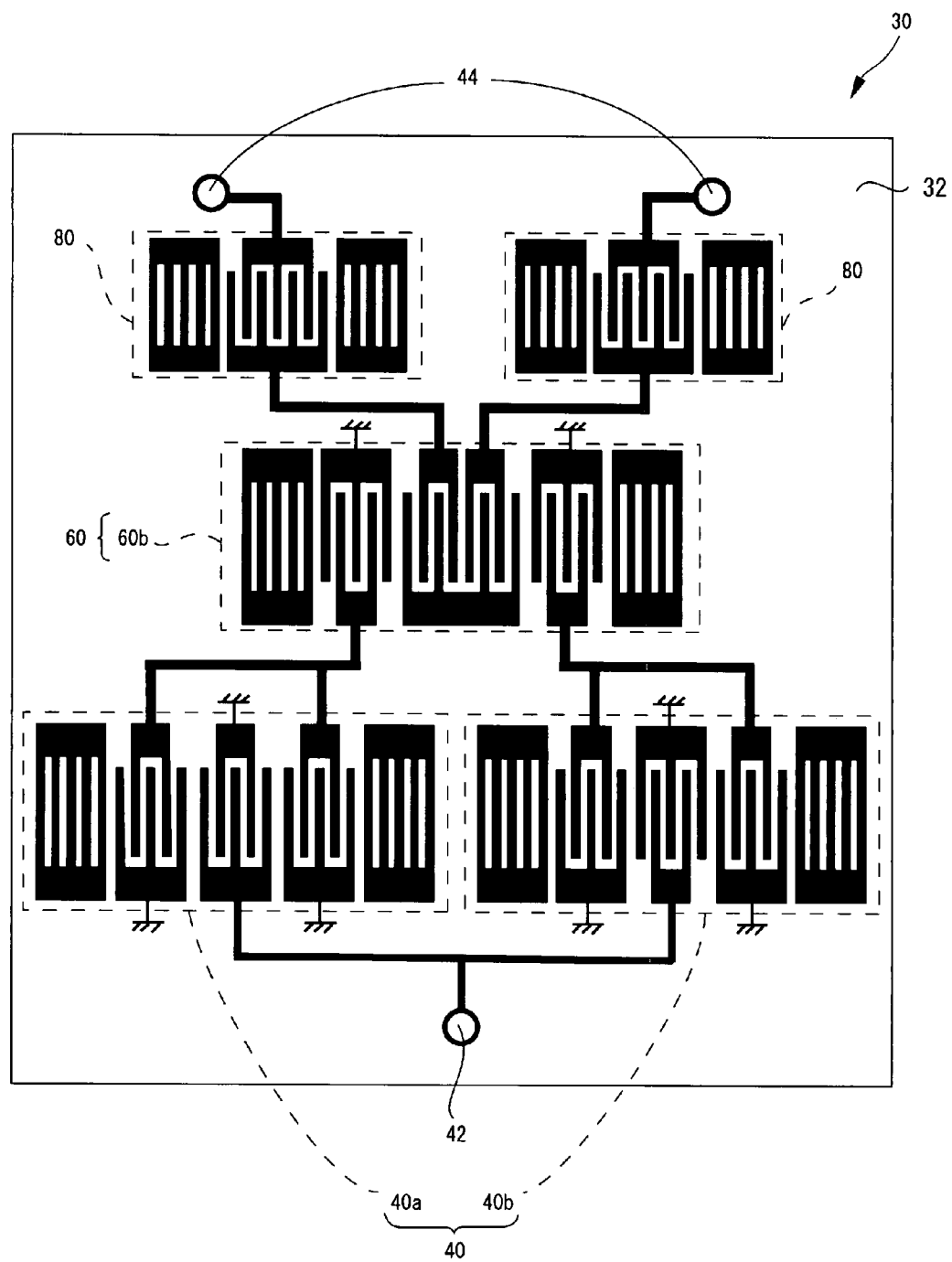
FIG. 10 schematically shows a balance filter in accordance with a second variation of the sixth embodiment.

FIG. 8 schematically shows a balance filter in accordance with a sixth embodiment. FIG. 9 schematically shows a first variation of the sixth embodiment, and FIG. 10 schematically shows a second variation thereof. Referring to FIG. 8, the balance filter 30 has the piezoelectric substrate 32 on which the first filter 40, the second filter 60 and a SAW resonator 80 are formed. The sixth embodiment has the same configurations as the balance filter of the second embodiment in terms of the first filter 40, the second filter 60, the connections between the first filter 40 and the second filter 60, and the connections between the second filter 60 and the second terminals 44, and a description will thus be omitted here. The SAW resonator 80 is made up of a pair of reflection electrodes R4 between which an IDT20 is interposed. The SAW resonator 80 is connected in series between the first terminal 42 and the first filter 40.

FIG. 9 shows the first variation, which is a balance filter in which SAW resonators 80 are connected in series between the first filter 40 and the second filter 60. FIG. 10 shows the second variation, which is a balance filter in which SAW resonators are connected in series between the second filter 60 and the second terminals 44. The other structures of the first and second variations are similar to those of the sixth embodiment shown in FIG. 8.

Figure 11:
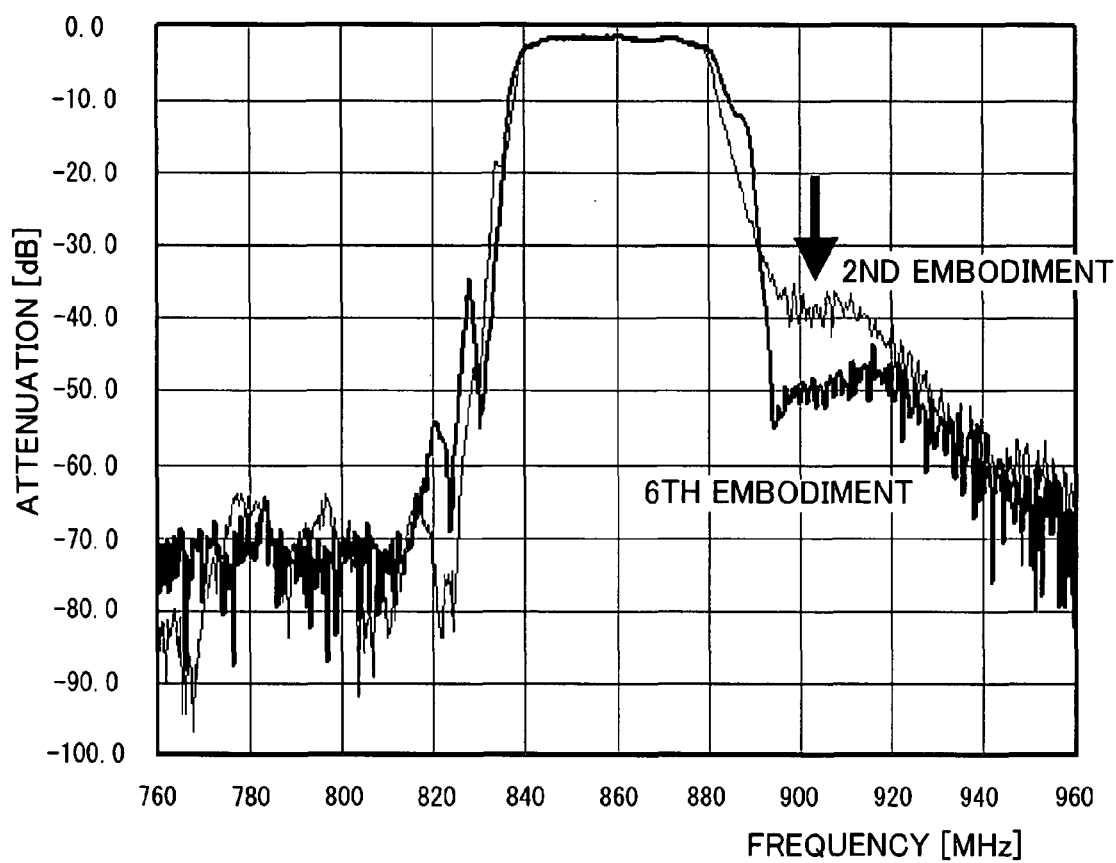
FIG. 11 is a graph of bandpass characteristics of the balance filters of the sixth and second embodiments.

FIG. 11 is a graph of bandpass characteristics of the balance filter of the sixth embodiment and the second embodiment. A thick line relates to the sixth embodiment, and a thin line relates to the second embodiment. The sixth embodiment and the second embodiment have almost identical insertion losses in the pass band. In contrast, the sixth embodiment has a rapid increase in attenuation in a range (around 900 MHz) at the higher side of the pass band, as compared with the second embodiment. The sixth embodiment is capable of sharply increasing attenuation at frequencies higher than those of the pass band without degrading the insertion loss. It is thus possible to suppress crosstalk and realize improved bandpass characteristics.

The first and second variations of the sixth embodiment have almost the same characteristics as shown in FIG. 11.

The sixth embodiment has the same configurations as the second embodiment in terms of the first filter 40, the connections between the first filter 40 and the second filter 60, and the connections between the second filter 60 and the second terminals 44. It is thus possible to improve the power durability, the amplitude and phase balance characteristics, the bandpass characteristics due to the high impedance between the second terminals 44, the balance adjustment after packaging and design of the package layout, as in the case of the second embodiment.

The sixth embodiment and the first and second variations thereof are based on the second embodiment. The concept of the sixth embodiment may be applied to the first, third, fourth and fifth embodiments, and similar advantages may be obtained.

In the balance filters of the sixth embodiment and the first and second variations thereof, one SAW resonator is arranged between the first terminal 42 and each of the second terminals 44. Alternatively, multiple SAW resonators may be provided between the first terminal 42 and each of the second terminals 44. With this arrangement, it is possible to obtain attenuation as much as that in the sixth embodiment and the first and second variations thereof or more.

In the foregoing, the first terminals 42 in the first through third and sixth embodiment are input pads formed on the chip. However, the first terminals 42 may be input leads or input footpads when the balance filter is mounted on a substrate or package.

In the foregoing, the first terminals 42 in the fourth and fifth embodiments are input leads or input footpads because these embodiments are balance filters mounted on a substrate of package. When the fourth or fifth embodiments are formed on a chip, the first terminals 42 may be input pads.

In the foregoing, the fourth and fifth embodiments employ the wires 41 for making connections between the first terminal 42 and the pads 43. These connections may be made by another connecting method such as bumps.

In the foregoing, the first through sixth embodiments have the first terminal 42 serving as the input terminal and the second terminals 44 serving as the output terminals. Alternatively, the first terminal 42 may serve as an output terminal, and the second terminals 44 may serve as input terminals.

Seventh Embodiment

Figure 12:
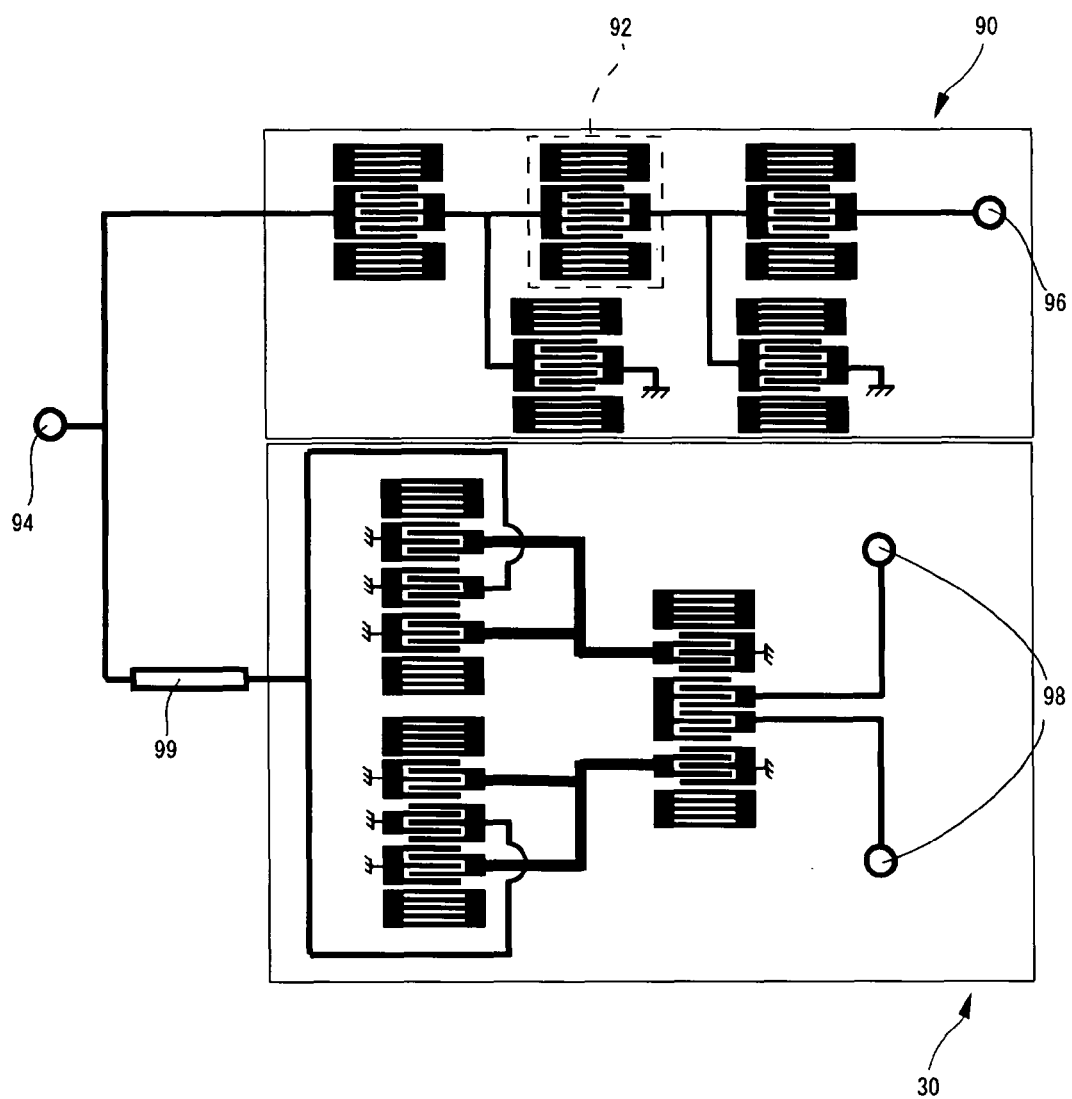
FIG. 12 schematically shows a balance filter in accordance with a seventh embodiment.

FIG. 12 schematically shows a duplexer in accordance with a seventh embodiment. Referring to FIG. 12, the duplexer includes a ladder type SAW filter 90 and the balance filter 30. The ladder type SAW filter 90 is a transmit filter of the duplexer, and the balance filter 30 is a receive filter thereof. One end of the ladder-type SAW filter 90 is connected to an antenna terminal 94, and the other end thereof is connected to a transmit terminal 96. One end of the balance filter 30 is connected to the antenna terminal 94 via a matching circuit 99, and the other end thereof is connected to a receive terminal 98.

The ladder-type SAW filter 90 is made up of one-port SAW resonators 92 arranged in a ladder form. The balance filter 30 may be any of the first through sixth embodiments.

Since high power is applied to the transmit filter, the transmit filter is formed by the ladder-type SAW filter having high power durability. Since the receive filter is required to have a large amount of attenuation at frequencies outside of the pass band and sharp cutoff performance, the receive filter is formed by the balance filter 30 of the multimode SAW filter.

When the balance filters of the first through sixth embodiments are used as receive filters, it is possible to provide duplexers having good power durability, good amplitude and phase balance characteristics, easy balance adjustment, and good bandpass characteristics.

Particularly, when the balance filter of any of the fourth embodiment, the sixth embodiment and the first and second variations of the sixth embodiment, it is possible to obtain a larger amount of attenuation at frequencies outside of the pass band and sharply increase the attenuation. The duplexer thus structured has reduced crosstalk and improved bandpass characteristics.

The present invention is not limited to the specifically disclosed embodiments, but other embodiments and variations may be made without departing from the scope of the claimed invention.

The present application is based on Japanese Patent Application No. 2006-233416 filed on Aug. 30, 2006, the entire disclosure of which is hereby incorporated by reference.

What is claimed is:

1. A balance filter comprising:
a first filter having first multimode surface acoustic wave (SAW) filters connected in parallel;
a second filter that is connected to the first filter and includes one second multimode SAW filter
a first terminal connected to the first filter; and
second terminals connected to the second filter, an input terminal of the balance filter being one of the first and second terminals, and an output terminal thereof being the other,
electric signals transmitted from the first filter to the second filter or vice versa being in opposite phase,
electric signals being input or output via the second terminals in opposite phase,
wherein the first terminal is connected to the first filter from the side of the first filter closest to the second filter; and
wherein an interdigital transducer (IDT) located in the center of the second filter has two electrodes, one of the two electrodes is connected to one of the second terminals, and the other is connected to another one of the second terminals.

2. The balance filter as claimed in claim 1, wherein the first filter has an IDT having two electrodes that are coupled in series via a floating conductor in an aperture-length direction.

3. The balance filter as claimed in claim 1, further comprising a SAW resonator connected in series between the first terminal and the second terminals.

4. The balance filter as claimed in claim 1, wherein the first and second terminals are the input and output terminals, respectively.

5. A balance filter comprising:
a first filter having first multimode surface acoustic wave (SAW) filters connected in parallel;
a second filter that is connected to the first filter and includes one second multimode SAW filter
a first terminal connected to the first filter; and
second terminals connected to the second filter, an input terminal of the balance filter being one of the first and second terminals, and an output terminal thereof being the other,
electric signals transmitted from the first filter to the second filter or vice versa being in opposite phase,
electric signals being input or output via the second terminals in opposite phase,
wherein the first terminal is connected to the first filter from the side of the first filter closest to the second filter, and
wherein an IDT located in the center of the second filter has two electrodes;
one of the two electrodes is divided into two;
one of two divided electrodes is connected to one of the second terminals, and the other is connected to another one of the second terminals.

6. The balance filter as claimed in claim 5, wherein the first filter has an IDT having two electrodes that are coupled in series via a floating conductor in an aperture-length direction.

7. The balance filter as claimed in claim 5, further comprising a SAW resonator connected in series between the first terminal and the second terminals.

8. The balance filter as claimed in claim 5, wherein the first and second terminals are the input and output terminals, respectively.

9. A duplexer comprising:
an antenna terminal;
a transmit filter connected to the antenna terminal; and
a receive filter connected to the antenna terminal, the receive filter including:
a first filter having first multimode surface acoustic wave (SAW) filters connected in parallel;
a second filter that is connected to the first filter and includes one second multimode SAW filter;
a first terminal connected to the first filter; and
second terminals connected to the second filter, an input terminal of the receive filter being one of the first and second terminals, and an output terminal thereof being the other,
electric signals transmitted from the first filter to the second filter or vice versa being in opposite phase,
electric signals being input or output via the second terminals in opposite phase,
wherein the first terminal is connected to the first filter from the side of the first filter closest to the second filter, and wherein an interdigital transducer (IDT) located in the center of the second filter has two electrodes, one of the two electrodes is connected to one of the second terminals and the other is connected to another one of the second terminals.

10. The duplexer as claimed in claim 9, wherein the transmit filter is a ladder-type SAW filter.

11. A duplexer comprising:
an antenna terminal;
a transmit filter connected to the antenna terminal; and
a receive filter connected to the antenna terminal, the receive filter including:
a first filter having first multimode surface acoustic wave (SAW) filters connected in parallel;
a second filter that is connected to the first filter and includes one second multimode SAW filter;
a first terminal connected to the first filter; and
second terminals connected to the second filter, an input terminal of the receive filter being one of the first and second terminals, and an output terminal thereof being the other,
electric signals transmitted from the first filter to the second filter or vice versa being in opposite phase,
electric signals being input or output via the second terminals in opposite phase,
wherein the first terminal is connected to the first filter from the side of the first filter closest to the second filter, and
wherein an IDT located in the center of the second filter has two electrodes, one of the two electrodes is divided into two, one of two divided electrodes is connected to one of the second terminals and the other is connected to another one of the second terminals.

12. The duplexer as claimed in claim 11, wherein the transmit filter is a ladder-type SAW filter.

* * * * *